US 11,701,754 B2

(12) United States Patent
Leggett et al.

(10) Patent No.: US 11,701,754 B2
(45) Date of Patent: Jul. 18, 2023

(54) ARTICLE AND METHOD OF MANUFACTURING THE SAME

(71) Applicant: Rolls-Royce plc, London (GB)

(72) Inventors: Andrew J Leggett, Derby (GB); Grant J Gibson, Derby (GB)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 17/176,456

(22) Filed: Feb. 16, 2021

(65) Prior Publication Data
US 2021/0316418 A1    Oct. 14, 2021

(30) Foreign Application Priority Data
Feb. 21, 2020 (GB) ..................... 2002451

(51) Int. Cl.
*B24C 1/10* (2006.01)

(52) U.S. Cl.
CPC ..................... *B24C 1/10* (2013.01)

(58) Field of Classification Search
CPC ....... B24C 1/10; F05D 2230/90; Y02T 50/60; C21D 7/02; C21D 7/04; C21D 7/06; C23C 10/02; C23C 10/28; C23C 10/30; C23C 10/32; C23C 10/38; C23C 10/52; C23C 10/54; C23C 10/60; C23C 16/06; C23C 16/56; C23C 28/321; C23C 28/322; C23C 28/345; C23C 30/00; F01D 5/28; F01D 5/288; F01D 25/005
See application file for complete search history.

(56) References Cited

U.S. PATENT DOCUMENTS

| | | | |
|---|---|---|---|
| 6,565,931 B1 * | 5/2003 | Rickerby | C23C 10/52 205/228 |
| 6,843,861 B2 * | 1/2005 | Grossman | C23C 10/52 228/208 |
| 6,884,524 B2 * | 4/2005 | Ackermann | C23C 10/02 428/650 |
| 7,341,427 B2 * | 3/2008 | Farmer | F01D 9/041 415/115 |
| 7,364,801 B1 | 4/2008 | Hazel et al. | |
| 9,777,583 B2 * | 10/2017 | Leggett | F01D 5/288 |

(Continued)

FOREIGN PATENT DOCUMENTS

| EP | 1094131 A2 | 4/2001 |
|---|---|---|
| WO | 2014/165073 A1 | 10/2014 |

OTHER PUBLICATIONS

Feb. 24, 2021 extended Search Report issued in European Patent Application No. 21153170.2.

*Primary Examiner* — Ryan J. Walters
(74) *Attorney, Agent, or Firm* — Oliff PLC

(57) ABSTRACT

An article and a method of manufacturing the article is disclosed. The method includes providing the article including a substrate and a coating at least partially disposed on the substrate. The coating includes an outer surface. The coating further includes platinum and chromium. The method further includes applying cold work to the outer surface of the coating to produce a cold-worked layer extending from the outer surface of the coating to a cold work depth. The cold-worked layer includes approximately 45% cold work. The cold work depth is between about 30 microns to about 150 microns from the outer surface of the coating.

10 Claims, 9 Drawing Sheets

(56) References Cited

U.S. PATENT DOCUMENTS

| | | | |
|---|---|---|---|
| 2004/0126496 A1* | 7/2004 | Ackermann | C23C 10/28 427/379 |
| 2010/0132429 A1* | 6/2010 | Murakami | C21D 7/13 420/87 |
| 2010/0330393 A1 | 12/2010 | Hazel et al. | |
| 2014/0271220 A1* | 9/2014 | Leggett | F01D 5/3092 420/466 |

* cited by examiner

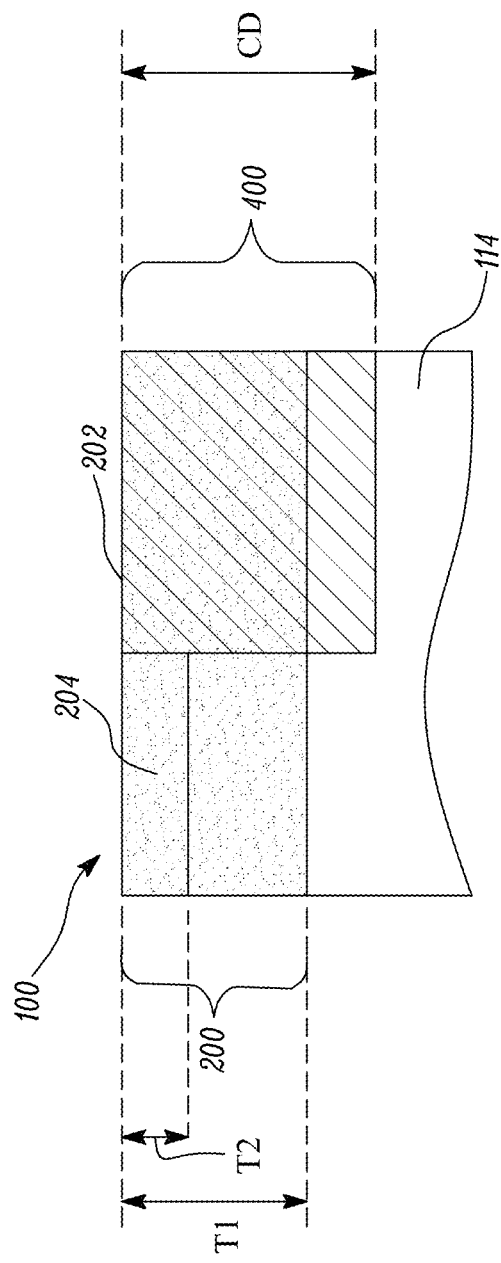
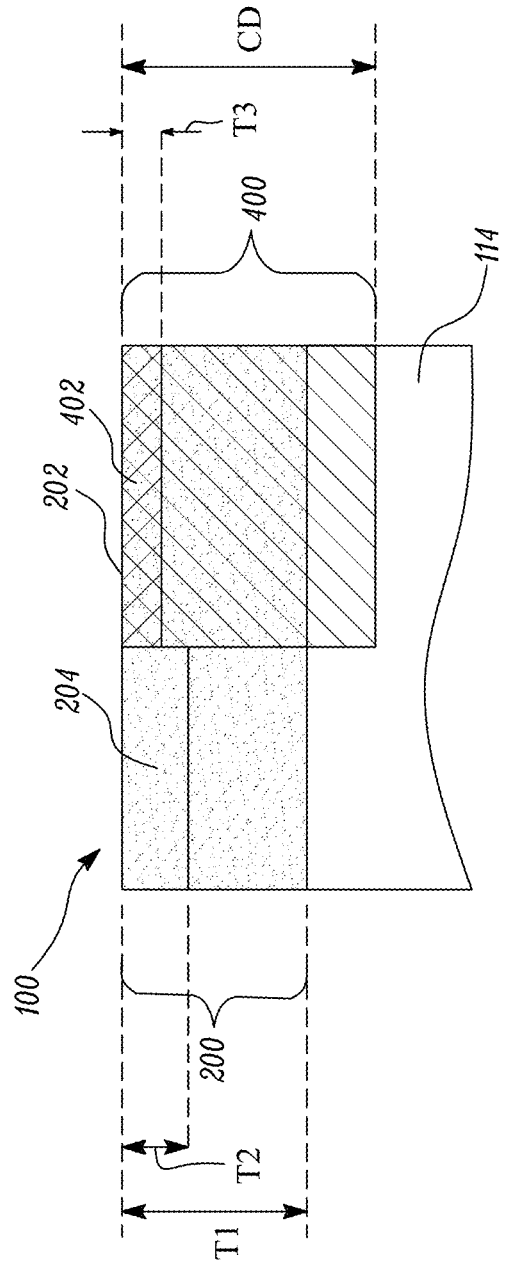
FIG. 7A
FIG. 7B

ARTICLE AND METHOD OF MANUFACTURING THE SAME

CROSS-REFERENCE TO RELATED APPLICATIONS

This specification is based upon and claims the benefit of priority from UK Patent Application Number 2002451.9 filed on 21 Feb. 2020, the entire contents of which are incorporated herein by reference.

BACKGROUND

Field of the Disclosure

The present disclosure is related to an article and a method of manufacturing the article.

Description of the Related Art

Coatings, such as diffusion coatings, are typically applied to various components of a gas turbine engine to protect the components against environmental attack. The components may include turbine blades. Further, the coatings may protect the turbine blades against environmental attack from sulphur bearing species. Such attacks may include pitting attack which can lead to cracking, thereby compromising a design of the turbine blade and reducing its life. Existing coatings may protect the turbine blades against Type II Sulphidation that generally occurs at 600° C. to 750° C., Type I Sulphidation that generally occurs at 750° C. to 900° C., or high temperature oxidation that generally occurs above 900° C. Thus, existing coatings generally target degradation modes occurring at temperatures above 600° C.

However, environmental degradation can also occur below 600° C. Type IV corrosion-fatigue attack can occur below 600° C., leading to cracking of turbine blades below expected stress and temperature thresholds. Type IV corrosion-fatigue attack can occur below thresholds associated with Type II Sulphidation. This may be because Type IV corrosion-fatigue attack generates a different morphology of environmental attack before leading to cracking. For example, Type IV corrosion-fatigue attack can lead to cracking in a material at short time intervals without the need for a pit to form at a surface of the material. This mode of degradation can cause embrittling of the applied coatings that would otherwise have provided protection from sulphur bearing environments.

SUMMARY

The present disclosure provides a method, an article, a turbine, and a gas turbine engine, as set out in the appended claims.

According to a first aspect, there is provided a method of manufacturing an article. The method includes providing an article including a substrate and a coating at least partially disposed on the substrate. The coating includes an outer surface. The coating further includes platinum and chromium. The method further includes applying cold work to the outer surface of the coating to produce a cold-worked layer extending from the outer surface of the coating to a cold work depth. The cold-worked layer includes approximately 45% cold work. The cold work depth is between about 30 microns to about 150 microns from the outer surface of the coating.

Applying cold work to the outer surface of the coating may improve corrosion-fatigue of the article. Specifically, the cold-worked layer may improve resistance of the article to Type IV corrosion-fatigue attack. Imparting cold work to the outer surface of the coating may provide improved retardation of coating cracks that can otherwise be formed due to Type IV corrosion-fatigue attack. The cold-worked layer may therefore protect the coating against Type IV corrosion-fatigue attack that could otherwise cause embrittling of the coating. The coating may continue to protect the substrate from environmental degradation. The corrosion-fatigue performance of the combination of the cold-worked layer and the coating may therefore be better than only cold work or only the coating.

In some embodiments, applying cold work may further include shot peening the outer surface of the coating using shot.

Shot peening may result in the cold-worked layer extending from the outer surface of the coating.

In some embodiments, an intensity of shot peening may be between about 2 A to about 12 A. The intensity of shot peening is imperial intensity such that 2 A is equivalent to 0.002 inches and 12 A is equivalent to 0.012 inches.

In some embodiments, the shot may be between about 070 to about 330 conforming to at least one of AMS2431/1, AMS2431/2, AMS2431/3, AMS2431/4, AMS2431/5, AMS2431/5, AMS2431/6, AMS2431/7, and AMS2431/8 specifications.

In some embodiments, a coverage of shot peening may be between about 95% to about 1200%.

The various shot peening parameters including the intensity of shot peening, shot media, and the coverage of shot peening may be selected in order to produce approximately 45% cold work in the cold-worked layer having the cold work depth between about 30 microns to about 150 microns.

In some embodiments, applying cold work may further include deep cold rolling the outer surface of the coating.

Deep cold rolling may result in the cold-worked layer extending from the outer surface of the coating.

In some embodiments, the cold-worked layer may further include a chromia scale extending from the outer surface of the coating. A thickness of the chromia scale may be less than the cold work depth.

In some embodiments, the thickness of the chromia scale may be less than a thickness of the coating.

The chromia scale may be formed due to exposure of the article to a corrosive contaminated environment for a predetermined time period. The cold work may aid in the formation of the chromia scale at the outer surface of the coating. The chromia scale may be formed due to a single gamma phase outer zone of the coating. The single gamma phase outer zone of the coating may be enriched with chromium. The chromia scale may be a stable oxidised layer of chromium formed in the single gamma phase outer zone of the coating. The chromia scale may also include other metal oxides. The chromia scale may provide additional corrosion resistance. The combination of the cold-worked layer and the coating may therefore provide an improved corrosion resistance and crack retardation. Specifically, the cold-worked layer along with the chromia scale may provide an improved combined resistance to Type IV corrosion-fatigue attack. The corrosion-fatigue performance of the combination of the cold-worked layer and the coating may therefore be better than only cold work or only the coating.

In some embodiments. the cold work depth may be greater than the thickness of the coating. This may ensure that a whole of the coating is provided with cold work.

Therefore, the whole of the coating may have improved corrosion-fatigue performance.

In some embodiments, the coating may include between about 8 wt. % to about 80 wt. % of chromium. Such a weight % of chromium may result in the formation of the single gamma phase outer zone that is enriched with chromium.

According to a second aspect, an article is provided. The article includes a substrate and a coating at least partially disposed on the substrate. The coating includes an outer surface. The coating further includes platinum and chromium. The article further includes a cold-worked layer extending from the outer surface of the coating to cold work depth. The cold-worked layer includes approximately 45% cold work. The cold work depth is between about 30 microns to about 150 microns from the outer surface of the coating.

The cold-worked layer extending from the outer surface of the coating may improve corrosion-fatigue of the article. Specifically, the cold-worked layer may improve resistance of the article to Type IV corrosion-fatigue attack. The cold-worked layer may provide improved retardation of coating cracks that can otherwise be formed due to Type IV corrosion-fatigue attack. The cold-worked layer may therefore protect the coating against Type IV corrosion-fatigue attack that could otherwise cause embrittling of the coating. The coating may continue to protect the substrate from environmental degradation. The corrosion-fatigue performance of the combination of the cold-worked layer and the coating may therefore be better than only cold work or only the coating.

The coating and the cold-worked layer may be applicable to articles made of superalloys, such as nickel based superalloys. Such articles may operate in a temperature range from 400° C. to 750° C. in corrosive contaminated environments.

In some embodiments, the article may be a turbine blade.

In some embodiments, the turbine blade may include an aerofoil, a platform, a shank and a root. The coating may be disposed on the shank and the root of the turbine blade. The shank and the root may therefore be protected against environmental attacks.

In some embodiments, the article may be an aerofoil or a vane.

In some other embodiments, the articles may be used in boilers, such as biomass boilers. In some other embodiments, the articles may be used in oil and gas industry. In some other embodiments, the articles may be used in a nuclear reactor.

In some embodiments, the cold-worked layer may further include a chromia scale extending from the outer surface of the coating. A thickness of the chromia scale may be less than the cold work depth.

In some embodiments, a thickness of the chromia scale may be less than a thickness of the coating.

The chromia scale may be formed due to exposure of the article to a corrosive contaminated environment for a predetermined time period. The chromia scale may be a stable oxidised layer of chromium formed in a single gamma phase outer zone of the coating. The chromia scale may also include other metal oxides. The chromia scale may provide additional corrosion resistance. The combination of the cold-worked layer and the coating may therefore provide an improved corrosion resistance and crack retardation. Specifically, the cold-worked layer along with the chromia scale may provide an improved combined resistance to Type IV corrosion-fatigue attack. The corrosion-fatigue performance of the combination of the cold-worked layer and the coating may therefore be better than only cold work or only the coating.

In some embodiments, the cold work depth may be greater than the thickness of the coating. This may ensure that a whole of the coating is provided with cold work. Therefore, the whole of the coating may have improved corrosion-fatigue performance.

In some embodiments, the coating may include between about 8 wt. % to about 80 wt. % of chromium. Such a weight % of chromium may result in the formation of the single gamma phase outer zone that is enriched with chromium.

According to a third aspect, there is provided a turbine for a gas turbine engine. The turbine includes the article of the second aspect.

According to a fourth aspect, there is provided a gas turbine engine for an aircraft. The gas turbine engine includes the turbine of the third aspect.

As noted elsewhere herein, the present disclosure may relate to a gas turbine engine. Such a gas turbine engine may comprise an engine core comprising a turbine, a combustor, a compressor, and a core shaft connecting the turbine to the compressor. Such a gas turbine engine may comprise a fan (having fan blades) located upstream of the engine core.

Arrangements of the present disclosure may be particularly, although not exclusively, beneficial for fans that are driven via a gearbox. Accordingly, the gas turbine engine may comprise a gearbox that receives an input from the core shaft and outputs drive to the fan so as to drive the fan at a lower rotational speed than the core shaft. The input to the gearbox may be directly from the core shaft, or indirectly from the core shaft, for example via a spur shaft and/or gear. The core shaft may rigidly connect the turbine and the compressor, such that the turbine and compressor rotate at the same speed (with the fan rotating at a lower speed).

The gas turbine engine as described and/or claimed herein may have any suitable general architecture. For example, the gas turbine engine may have any desired number of shafts that connect turbines and compressors, for example one, two or three shafts. Purely by way of example, the turbine connected to the core shaft may be a first turbine, the compressor connected to the core shaft may be a first compressor, and the core shaft may be a first core shaft. The engine core may further comprise a second turbine, a second compressor, and a second core shaft connecting the second turbine to the second compressor. The second turbine, second compressor, and second core shaft may be arranged to rotate at a higher rotational speed than the first core shaft.

In such an arrangement, the second compressor may be positioned axially downstream of the first compressor. The second compressor may be arranged to receive (for example directly receive, for example via a generally annular duct) flow from the first compressor.

The gearbox may be arranged to be driven by the core shaft that is configured to rotate (for example in use) at the lowest rotational speed (for example the first core shaft in the example above). For example, the gearbox may be arranged to be driven only by the core shaft that is configured to rotate (for example in use) at the lowest rotational speed (for example only be the first core shaft, and not the second core shaft, in the example above). Alternatively, the gearbox may be arranged to be driven by any one or more shafts, for example the first and/or second shafts in the example above.

The gearbox may be a reduction gearbox (in that the output to the fan is a lower rotational rate than the input from the core shaft). Any type of gearbox may be used. For example, the gearbox may be a "planetary" or "star" gearbox, as described in more detail elsewhere herein. The gearbox may have any desired reduction ratio (defined as the rotational speed of the input shaft divided by the rotational speed of the output shaft), for example greater than 2.5, for example in the range of from 3 to 4.2, or 3.2 to 3.8, for example on the order of or at least 3, 3.1, 3.2, 3.3, 3.4, 3.5, 3.6, 3.7, 3.8, 3.9, 4, 4.1 or 4.2. The gear ratio may be, for example, between any two of the values in the previous sentence. Purely by way of example, the gearbox may be a "star" gearbox having a ratio in the range of from 3.1 or 3.2 to 3.8. In some arrangements, the gear ratio may be outside these ranges.

In any gas turbine engine as described and/or claimed herein, a combustor may be provided axially downstream of the fan and compressor(s). For example, the combustor may be directly downstream of (for example at the exit of) the second compressor, where a second compressor is provided. By way of further example, the flow at the exit to the combustor may be provided to the inlet of the second turbine, where a second turbine is provided. The combustor may be provided upstream of the turbine(s).

The or each compressor (for example the first compressor and second compressor as described above) may comprise any number of stages, for example multiple stages. Each stage may comprise a row of rotor blades and a row of stator vanes, which may be variable stator vanes (in that their angle of incidence may be variable). The row of rotor blades and the row of stator vanes may be axially offset from each other.

The or each turbine (for example the first turbine and second turbine as described above) may comprise any number of stages, for example multiple stages. Each stage may comprise a row of rotor blades and a row of stator vanes. The row of rotor blades and the row of stator vanes may be axially offset from each other.

Each fan blade may be defined as having a radial span extending from a root (or hub) at a radially inner gas-washed location, or 0% span position, to a tip at a 100% span position. The ratio of the radius of the fan blade at the hub to the radius of the fan blade at the tip may be less than (or on the order of) any of: 0.4, 0.39, 0.38 0.37, 0.36, 0.35, 0.34, 0.33, 0.32, 0.31, 0.3, 0.29, 0.28, 0.27, 0.26, or 0.25. The ratio of the radius of the fan blade at the hub to the radius of the fan blade at the tip may be in an inclusive range bounded by any two of the values in the previous sentence (i.e. the values may form upper or lower bounds), for example in the range of from 0.28 to 0.32. These ratios may commonly be referred to as the hub-to-tip ratio. The radius at the hub and the radius at the tip may both be measured at the leading edge (or axially forwardmost) part of the blade. The hub-to-tip ratio refers, of course, to the gas-washed portion of the fan blade, i.e. the portion radially outside any platform.

The radius of the fan may be measured between the engine centreline and the tip of a fan blade at its leading edge. The fan diameter (which may simply be twice the radius of the fan) may be greater than (or on the order of) any of: 220 cm, 230 cm, 240 cm, 250 cm (around 100 inches), 260 cm, 270 cm (around 105 inches), 280 cm (around 110 inches), 290 cm (around 115 inches), 300 cm (around 120 inches), 310 cm, 320 cm (around 125 inches), 330 cm (around 130 inches), 340 cm (around 135 inches), 350 cm, 360 cm (around 140 inches), 370 cm (around 145 inches), 380 cm (around 150 inches) cm, 390 cm (around 155 inches), 400 cm, 410 cm (around 160 inches) or 420 cm (around 165 inches). The fan diameter may be in an inclusive range bounded by any two of the values in the previous sentence (i.e. the values may form upper or lower bounds), for example in the range of from 240 cm to 280 cm or 330 cm to 380 cm.

The rotational speed of the fan may vary in use. Generally, the rotational speed is lower for fans with a higher diameter. Purely by way of non-limitative example, the rotational speed of the fan at cruise conditions may be less than 2500 rpm, for example less than 2300 rpm. Purely by way of further non-limitative example, the rotational speed of the fan at cruise conditions for an engine having a fan diameter in the range of from 220 cm to 300 cm (for example 240 cm to 280 cm or 250 cm to 270 cm) may be in the range of from 1700 rpm to 2500 rpm, for example in the range of from 1800 rpm to 2300 rpm, for example in the range of from 1900 rpm to 2100 rpm. Purely by way of further non-limitative example, the rotational speed of the fan at cruise conditions for an engine having a fan diameter in the range of from 330 cm to 380 cm may be in the range of from 1200 rpm to 2000 rpm, for example in the range of from 1300 rpm to 1800 rpm, for example in the range of from 1400 rpm to 1800 rpm.

In use of the gas turbine engine, the fan (with associated fan blades) rotates about a rotational axis. This rotation results in the tip of the fan blade moving with a velocity $U_{tip}$. The work done by the fan blades on the flow results in an enthalpy rise dH of the flow. A fan tip loading may be defined as $dH/U_{tip}^2$, where dH is the enthalpy rise (for example the 1-D average enthalpy rise) across the fan and $U_{tip}$ is the (translational) velocity of the fan tip, for example at the leading edge of the tip (which may be defined as fan tip radius at leading edge multiplied by angular speed). The fan tip loading at cruise conditions may be greater than (or on the order of) any of: 0.28, 0.29, 0.30, 0.31, 0.32, 0.33, 0.34, 0.35, 0.36, 0.37, 0.38, 0.39 or 0.4 (all units in this paragraph being $Jkg^{-1}K^{-1}/(ms^{-1})^2$). The fan tip loading may be in an inclusive range bounded by any two of the values in the previous sentence (i.e. the values may form upper or lower bounds), for example in the range of from 0.28 to 0.31, or 0.29 to 0.3.

Gas turbine engines in accordance with the present disclosure may have any desired bypass ratio, where the bypass ratio is defined as the ratio of the mass flow rate of the flow through the bypass duct to the mass flow rate of the flow through the core at cruise conditions. In some arrangements the bypass ratio may be greater than (or on the order of) any of the following: 10, 10.5, 11, 11.5, 12, 12.5, 13, 13.5, 14, 14.5, 15, 15.5, 16, 16.5, 17, 17.5, 18, 18.5, 19, 19.5 or 20. The bypass ratio may be in an inclusive range bounded by any two of the values in the previous sentence (i.e. the values may form upper or lower bounds), for example in the range of form 12 to 16, 13 to 15, or 13 to 14. The bypass duct may be substantially annular. The bypass duct may be radially outside the engine core. The radially outer surface of the bypass duct may be defined by a nacelle and/or a fan case.

The overall pressure ratio of a gas turbine engine as described and/or claimed herein may be defined as the ratio of the stagnation pressure upstream of the fan to the stagnation pressure at the exit of the highest pressure compressor (before entry into the combustor). By way of non-limitative example, the overall pressure ratio of a gas turbine engine as described and/or claimed herein at cruise may be greater than (or on the order of) any of the following: 35, 40, 45, 50, 55, 60, 65, 70, 75. The overall pressure ratio may be in an inclusive range bounded by any two of the values in the previous sentence (i.e. the values may form upper or lower bounds), for example in the range of from 50 to 70.

Specific thrust of an engine may be defined as the net thrust of the engine divided by the total mass flow through the engine. At cruise conditions, the specific thrust of an engine described and/or claimed herein may be less than (or on the order of) any of the following: 110 $Nkg^{-1}$ s, 105 $Nkg^{-1}$ s, 100 $Nkg^{-1}$ s, 95 $Nkg^{-1}$ s, 90 $Nkg^{-1}$ s, 85 $Nkg^{-1}$ s or 80 $Nkg^{-1}$ s. The specific thrust may be in an inclusive range bounded by any two of the values in the previous sentence (i.e. the values may form upper or lower bounds), for example in the range of from 80 $Nkg^{-1}$ s to 100 $Nkg^{-1}$ s, or 85 $Nkg^{-1}$ s to 95 $Nkg^{-1}$ s. Such engines may be particularly efficient in comparison with conventional gas turbine engines.

A gas turbine engine as described and/or claimed herein may have any desired maximum thrust. Purely by way of non-limitative example, a gas turbine as described and/or claimed herein may be capable of producing a maximum thrust of at least (or on the order of) any of the following: 160 kN, 170 kN, 180 kN, 190 kN, 200 kN, 250 kN, 300 kN, 350 kN, 400 kN, 450 kN, 500 kN, or 550 kN. The maximum thrust may be in an inclusive range bounded by any two of the values in the previous sentence (i.e. the values may form upper or lower bounds). Purely by way of example, a gas turbine as described and/or claimed herein may be capable of producing a maximum thrust in the range of from 330 kN to 420 kN, for example 350 kN to 400 kN. The thrust referred to above may be the maximum net thrust at standard atmospheric conditions at sea level plus 15 degrees C. (ambient pressure 101.3 kPa, temperature 30 degrees C.), with the engine static.

In use, the temperature of the flow at the entry to the high pressure turbine may be particularly high. This temperature, which may be referred to as TET, may be measured at the exit to the combustor, for example immediately upstream of the first turbine vane, which itself may be referred to as a nozzle guide vane. At cruise, the TET may be at least (or on the order of) any of the following: 1400K, 1450K, 1500K, 1550K, 1600K or 1650K. The TET at cruise may be in an inclusive range bounded by any two of the values in the previous sentence (i.e. the values may form upper or lower bounds). The maximum TET in use of the engine may be, for example, at least (or on the order of) any of the following: 1700K, 1750K, 1800K, 1850K, 1900K, 1950K or 2000K. The maximum TET may be in an inclusive range bounded by any two of the values in the previous sentence (i.e. the values may form upper or lower bounds), for example in the range of from 1800K to 1950K. The maximum TET may occur, for example, at a high thrust condition, for example at a maximum take-off (MTO) condition.

A fan blade and/or aerofoil portion of a fan blade described and/or claimed herein may be manufactured from any suitable material or combination of materials. For example at least a part of the fan blade and/or aerofoil may be manufactured at least in part from a composite, for example a metal matrix composite and/or an organic matrix composite, such as carbon fibre. By way of further example at least a part of the fan blade and/or aerofoil may be manufactured at least in part from a metal, such as a titanium based metal or an aluminium based material (such as an aluminium-lithium alloy) or a steel based material. The fan blade may comprise at least two regions manufactured using different materials. For example, the fan blade may have a protective leading edge, which may be manufactured using a material that is better able to resist impact (for example from birds, ice or other material) than the rest of the blade. Such a leading edge may, for example, be manufactured using titanium or a titanium-based alloy. Thus, purely by way of example, the fan blade may have a carbon-fibre or aluminium based body (such as an aluminium lithium alloy) with a titanium leading edge.

A fan as described and/or claimed herein may comprise a central portion, from which the fan blades may extend, for example in a radial direction. The fan blades may be attached to the central portion in any desired manner. For example, each fan blade may comprise a fixture which may engage a corresponding slot in the hub (or disc). Purely by way of example, such a fixture may be in the form of a dovetail that may slot into and/or engage a corresponding slot in the hub/disc in order to fix the fan blade to the hub/disc. By way of further example, the fan blades may be formed integrally with a central portion. Such an arrangement may be referred to as a bladed disc or a bladed ring. Any suitable method may be used to manufacture such a bladed disc or bladed ring. For example, at least a part of the fan blades may be machined from a block and/or at least part of the fan blades may be attached to the hub/disc by welding, such as linear friction welding.

The gas turbine engines described and/or claimed herein may or may not be provided with a variable area nozzle (VAN). Such a variable area nozzle may allow the exit area of the bypass duct to be varied in use. The general principles of the present disclosure may apply to engines with or without a VAN.

The fan of a gas turbine as described and/or claimed herein may have any desired number of fan blades, for example 14, 16, 18, 20, 22, 24 or 26 fan blades.

As used herein, cruise conditions have the conventional meaning and would be readily understood by the skilled person. Thus, for a given gas turbine engine for an aircraft, the skilled person would immediately recognise cruise conditions to mean the operating point of the engine at mid-cruise of a given mission (which may be referred to in the industry as the "economic mission") of an aircraft to which the gas turbine engine is designed to be attached. In this regard, mid-cruise is the point in an aircraft flight cycle at which 50% of the total fuel that is burned between top of climb and start of descent has been burned (which may be approximated by the midpoint—in terms of time and/or distance—between top of climb and start of descent. Cruise conditions thus define an operating point of, the gas turbine engine that provides a thrust that would ensure steady state operation (i.e. maintaining a constant altitude and constant Mach Number) at mid-cruise of an aircraft to which it is designed to be attached, taking into account the number of engines provided to that aircraft. For example where an engine is designed to be attached to an aircraft that has two engines of the same type, at cruise conditions the engine provides half of the total thrust that would be required for steady state operation of that aircraft at mid-cruise.

In other words, for a given gas turbine engine for an aircraft, cruise conditions are defined as the operating point of the engine that provides a specified thrust (required to provide—in combination with any other engines on the aircraft—steady state operation of the aircraft to which it is designed to be attached at a given mid-cruise Mach Number) at the mid-cruise atmospheric conditions (defined by the International Standard Atmosphere according to ISO 2533 at the mid-cruise altitude). For any given gas turbine engine for an aircraft, the mid-cruise thrust, atmospheric conditions and Mach Number are known, and thus the operating point of the engine at cruise conditions is clearly defined.

Purely by way of example, the forward speed at the cruise condition may be any point in the range of from Mach 0.7 to 0.9, for example 0.75 to 0.85, for example 0.76 to 0.84, for example 0.77 to 0.83, for example 0.78 to 0.82, for example 0.79 to 0.81, for example on the order of Mach 0.8, on the order of Mach 0.85 or in the range of from 0.8 to 0.85. Any single speed within these ranges may be part of the cruise condition. For some aircraft, the cruise conditions may be outside these ranges, for example below Mach 0.7 or above Mach 0.9.

Purely by way of example, the cruise conditions may correspond to standard atmospheric conditions (according to the International Standard Atmosphere, ISA) at an altitude that is in the range of from 10000 m to 15000 m, for example in the range of from 10000 m to 12000 m, for example in the range of from 10400 m to 11600 m (around 38000 ft), for example in the range of from 10500 m to 11500 m, for example in the range of from 10600 m to 11400 m, for example in the range of from 10700 m (around 35000 ft) to 11300 m, for example in the range of from 10800 m to 11200 m, for example in the range of from 10900 m to 11100 m, for example on the order of 11000 m. The cruise conditions may correspond to standard atmospheric conditions at any given altitude in these ranges.

Purely by way of example, the cruise conditions may correspond to an operating point of the engine that provides a known required thrust level (for example a value in the range of from 30 kN to 35 kN) at a forward Mach number of 0.8 and standard atmospheric conditions (according to the International Standard Atmosphere) at an altitude of 38000 ft (11582 m). Purely by way of further example, the cruise conditions may correspond to an operating point of the engine that provides a known required thrust level (for example a value in the range of from 50 kN to 65 kN) at a forward Mach number of 0.85 and standard atmospheric conditions (according to the International Standard Atmosphere) at an altitude of 35000 ft (10668 m).

In use, a gas turbine engine described and/or claimed herein may operate at the cruise conditions defined elsewhere herein. Such cruise conditions may be determined by the cruise conditions (for example the mid-cruise conditions) of an aircraft to which at least one (for example 2 or 4) gas turbine engine may be mounted in order to provide propulsive thrust.

According to an aspect, there is provided an aircraft comprising a gas turbine engine as described and/or claimed herein. The aircraft according to this aspect is the aircraft for which the gas turbine engine has been designed to be attached. Accordingly, the cruise conditions according to this aspect correspond to the mid-cruise of the aircraft, as defined elsewhere herein.

According to an aspect, there is provided a method of operating a gas turbine engine as described and/or claimed herein. The operation may be at the cruise conditions as defined elsewhere herein (for example in terms of the thrust, atmospheric conditions and Mach Number).

According to an aspect, there is provided a method of operating an aircraft comprising a gas turbine engine as described and/or claimed herein. The operation according to this aspect may include (or may be) operation at the mid-cruise of the aircraft, as defined elsewhere herein.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which:

FIG. 7A is a detailed schematic sectional view of the turbine blade depicting the coating and a cold-worked layer;
FIG. 7B is a detailed schematic sectional view of the turbine blade depicting the coating, the cold-worked layer and a chromia scale.

DETAILED DESCRIPTION OF THE DISCLOSURE

Figure 1:
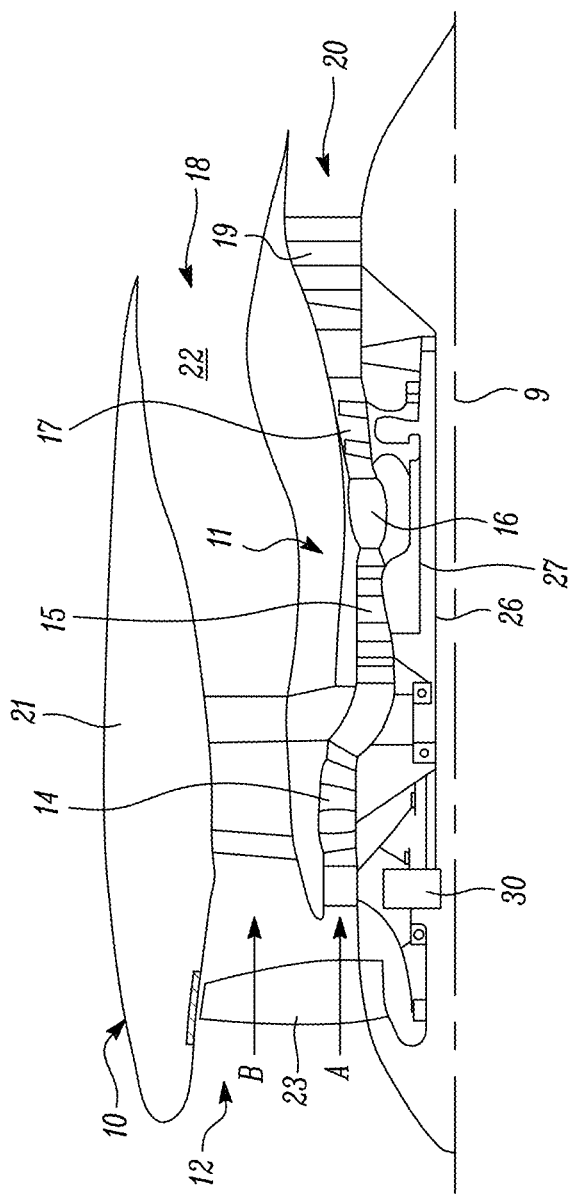
FIG. 1 is a sectional side view of a gas turbine engine.

Aspects and embodiments of the present disclosure will now be discussed with reference to the accompanying figures. Further aspects and embodiments will be apparent to those skilled in the art.

As used herein, the terms "about," "approximate," or "approximately" with reference to a numerical value means +/− five percent of the numerical value. For example, a depth of "about" 100 microns refers to a depth from 95 microns to 105 microns, but also expressly includes any narrower range of depth or even a single depth within that range, including, for example, a depth of exactly 100 microns. In another example, "approximately" 45% cold work refers to a cold work percentage from 42.75% to 47.25%, but also expressly includes any narrower range of cold work percentage or even a single cold work percentage within that range, including, for example, exactly 45% cold work.

As used herein, "chromia scale" refers to a stable oxidised layer of chromium extending from an outer or an exterior surface of an article. The chromia scale is typically formed due to exposure of the article to a corrosive contaminated environment for a predetermined time period.

As used herein, "single phase gamma outer zone" of a coating refers to an outer zone that extends from an outer surface of a coating. Single phase gamma outer zone is substantially devoid of phase boundaries and includes almost exclusively the gamma phase of an alloy forming the coating. Single phase gamma outer zone may be enriched with a metal, for example, chromium.

As used herein, "cold working" or "cold forming" refers to any metalworking process in which a metallic article is shaped below its recrystallization temperature, usually at the ambient temperature. Examples of cold working processes include shot peening and deep cold rolling. As used herein, "cold work" or "cold-worked layer" refers to a region, a layer or a portion of a given article that includes plastic strain induced by cold working. As used herein, "cold work depth" of a cold-worked layer is a depth or a thickness measured from an outer or exterior surface of a given article. Unless otherwise mentioned, plastic strain induced by cold working is present across the cold work depth. Plastic strain may also vary across the cold work depth.

In the present disclosure, an amount of cold work in a given article has been characterised as cold work percentage (%). Cold work % refers to the absolute value of a true plastic strain in the sample expressed as a percentage. For example, 45% cold work refers to 45% true plastic strain. Cold work % may be measured by various methods, for example, X-ray diffraction techniques.

Various parameters of shot peening process have been used in the present disclosure. Definitions of such parameters are provided below.

As used herein, "coverage of shot peening" or "shot peening coverage" is expressed as a percentage which relates to a surface coverage of a given article. For example, 100% coverage equates to one complete coverage of shot peening indents. 2000% coverage equates to 20 complete coverages of shot peening indents.

As used herein, "intensity of shot peening" or "shot peening intensity" refers to imperial Almen intensity consistent with Aerospace Material Specification AMS 2431 published by SAE International. Shot peening intensity is measured by peening a strip of Almen material, either A-type or N-type, for a sufficient length of time to achieve 98% coverage of the surface. The shot peening intensity is defined as the arc height of an Almen test strip measured at a coverage of 98% by using an Almen gauge. The amount of material deflection is measured in mils and the measure of the deflection is the peening intensity. Thus, if an A-type Almen strip is used, and deflection is measured to be 6 mils, then a 6 A peening intensity is achieved. In other words, 6 A is equivalent to 0.006 inches of deflection. The A-scale is the less severe peening scale as compared to the N-scale.

In the present disclosure, peening media or shot is characterised by a numeral followed by the letter "H". Further, "shot size" is given in inches. For example, 110H is equivalent to 0.011 inches and H denotes hard shot type. Peening media in the present disclosure conforms to at least one of Aerospace Material Specifications AMS 2431/1, AMS 2431/2, AMS 2431/3, AMS 2431/4, AMS 2431/5, AMS 2431/6, AMS 2431/7, or AMS 2431/8 published by SAE International. Details of these specifications are provided in Table 1 (provided below) of the present disclosure.

FIG. 1 illustrates a gas turbine engine 10 having a principal rotational axis 9. The engine 10 comprises an air intake 12 and a propulsive fan 23 that generates two airflows: a core airflow A and a bypass airflow B. The gas turbine engine 10 comprises a core 11 that receives the core airflow A. The engine core 11 comprises, in axial flow series, a low pressure compressor 14, a high pressure compressor 15, combustion equipment 16, a high pressure turbine 17, a low pressure turbine 19 and a core exhaust nozzle 20. A nacelle 21 surrounds the gas turbine engine 10 and defines a bypass duct 22 and a bypass exhaust nozzle 18. The bypass airflow B flows through the bypass duct 22. The fan 23 is attached to and driven by the low pressure turbine 19 via a shaft 26 and an epicyclic gearbox 30.

In use, the core airflow A is accelerated and compressed by the low pressure compressor 14 and directed into the high pressure compressor 15 where further compression takes place. The compressed air exhausted from the high pressure compressor 15 is directed into the combustion equipment 16 where it is mixed with fuel and the mixture is combusted. The resultant hot combustion products then expand through, and thereby drive, the high pressure and low pressure turbines 17, 19 before being exhausted through the core exhaust nozzle 20 to provide some propulsive thrust. The high pressure turbine 17 drives the high pressure compressor 15 by a suitable interconnecting shaft 27. The fan 23 generally provides the majority of the propulsive thrust. The epicyclic gearbox 30 is a reduction gearbox.

Figure 2:
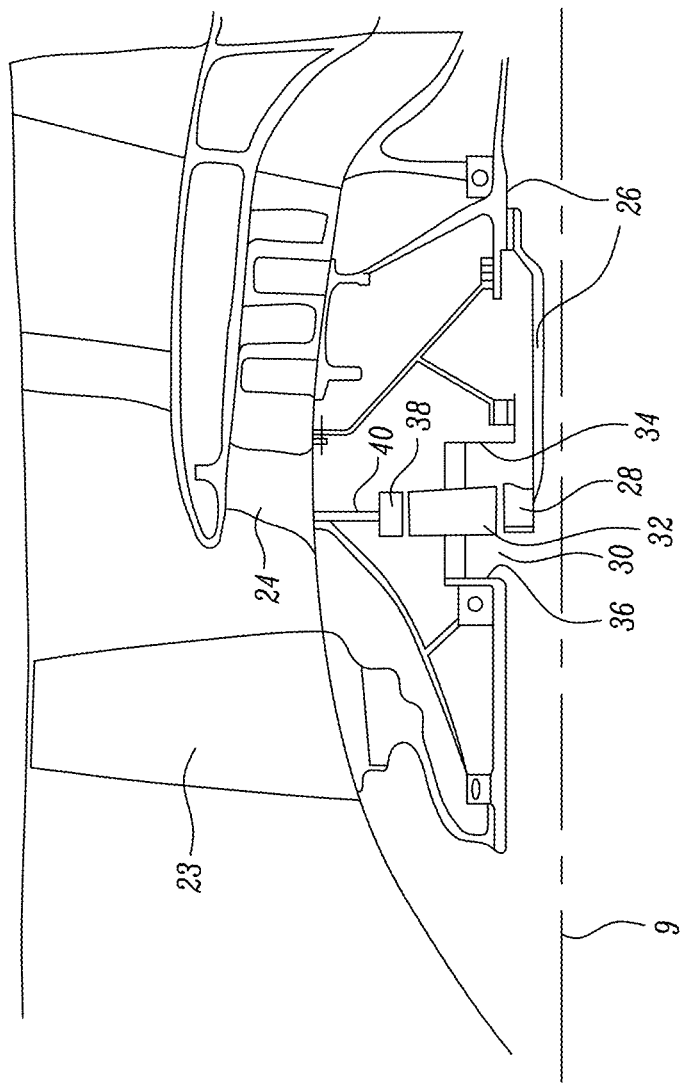
FIG. 2 is a close up sectional side view of an upstream portion of a gas turbine engine.

An exemplary arrangement for a geared fan gas turbine engine 10 is shown in FIG. 2. The low pressure turbine 19 (see FIG. 1) drives the shaft 26, which is coupled to a sun wheel, or sun gear, 28 of the epicyclic gear arrangement 30. Radially outwardly of the sun gear 28 and intermeshing therewith is a plurality of planet gears 32 that are coupled together by a planet carrier 34. The planet carrier 34 constrains the planet gears 32 to process around the sun gear 28 in synchronicity whilst enabling each planet gear 32 to rotate about its own axis. The planet carrier 34 is coupled via linkages 36 to the fan 23 in order to drive its rotation about the engine axis 9. Radially outwardly of the planet gears 32 and intermeshing therewith is an annulus or ring gear 38 that is coupled, via linkages 40, to a stationary supporting structure 24.

Note that the terms "low pressure turbine" and "low pressure compressor" as used herein may be taken to mean the lowest pressure turbine stages and lowest pressure compressor stages (i.e. not including the fan 23) respectively and/or the turbine and compressor stages that are connected together by the interconnecting shaft 26 with the lowest rotational speed in the engine (i.e. not including the gearbox output shaft that drives the fan 23). In some literature, the "low pressure turbine" and "low pressure compressor" referred to herein may alternatively be known as the "intermediate pressure turbine" and "intermediate pressure compressor". Where such alternative nomenclature is used, the fan 23 may be referred to as a first, or lowest pressure, compression stage.

Figure 3:
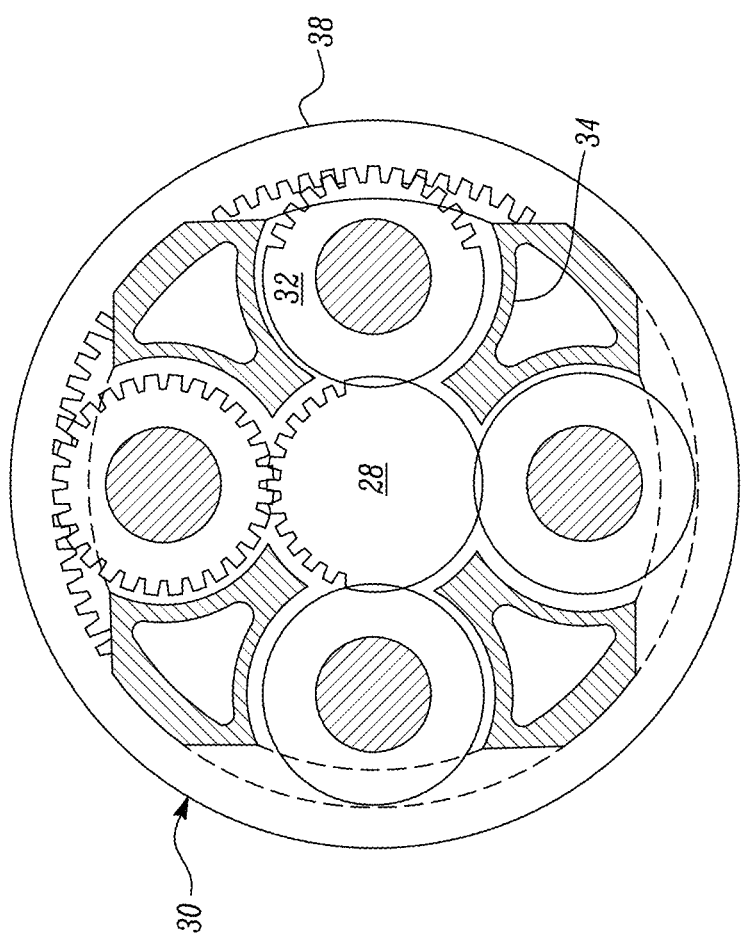
FIG. 3 is a partially cut-away view of a gearbox for a gas turbine engine.

The epicyclic gearbox 30 is shown by way of example in greater detail in FIG. 3. Each of the sun gear 28, planet gears 32 and ring gear 38 comprise teeth about their periphery to intermesh with the other gears. However, for clarity only exemplary portions of the teeth are illustrated in FIG. 3. There are four planet gears 32 illustrated, although it will be apparent to the skilled reader that more or fewer planet gears 32 may be provided within the scope of the claimed invention. Practical applications of a planetary epicyclic gearbox 30 generally comprise at least three planet gears 32.

The epicyclic gearbox 30 illustrated by way of example in FIGS. 2 and 3 is of the planetary type, in that the planet carrier 34 is coupled to an output shaft via linkages 36, with the ring gear 38 fixed. However, any other suitable type of epicyclic gearbox 30 may be used. By way of further example, the epicyclic gearbox 30 may be a star arrangement, in which the planet carrier 34 is held fixed, with the ring (or annulus) gear 38 allowed to rotate. In such an arrangement the fan 23 is driven by the ring gear 38. By way of further alternative example, the gearbox 30 may be a differential gearbox in which the ring gear 38 and the planet carrier 34 are both allowed to rotate.

It will be appreciated that the arrangement shown in FIGS. 2 and 3 is by way of example only, and various alternatives are within the scope of the present disclosure. Purely by way of example, any suitable arrangement may be used for locating the gearbox 30 in the engine 10 and/or for connecting the gearbox 30 to the engine 10. By way of further example, the connections (such as the linkages 36, 40 in the FIG. 2 example) between the gearbox 30 and other parts of the engine 10 (such as the input shaft 26, the output shaft and the fixed structure 24) may have any desired degree of stiffness or flexibility. By way of further example, any suitable arrangement of the bearings between rotating and stationary parts of the engine (for example between the input and output shafts from the gearbox and the fixed structures, such as the gearbox casing) may be used, and the disclosure is not limited to the exemplary arrangement of FIG. 2. For example, where the gearbox 30 has a star arrangement (described above), the skilled person would readily understand that the arrangement of output and support linkages and bearing locations would typically be different to that shown by way of example in FIG. 2.

Accordingly, the present disclosure extends to a gas turbine engine having any arrangement of gearbox styles (for example star or planetary), support structures, input and output shaft arrangement, and bearing locations.

Optionally, the gearbox may drive additional and/or alternative components (e.g. the intermediate pressure compressor and/or a booster compressor).

Other gas turbine engines to which the present disclosure may be applied may have alternative configurations. For example, such engines may have an alternative number of compressors and/or turbines and/or an alternative number of interconnecting shafts. By way of further example, the gas turbine engine shown in FIG. 1 has a split flow nozzle 18, 20 meaning that the flow through the bypass duct 22 has its own nozzle 18 that is separate to and radially outside the core exhaust nozzle 20. However, this is not limiting, and any aspect of the present disclosure may also apply to engines in which the flow through the bypass duct 22 and the flow through the core 11 are mixed, or combined, before (or upstream of) a single nozzle, which may be referred to as a mixed flow nozzle. One or both nozzles (whether mixed or split flow) may have a fixed or variable area. Whilst the described example relates to a turbofan engine, the disclosure may apply, for example, to any type of gas turbine engine, such as an open rotor (in which the fan stage is not surrounded by a nacelle) or turboprop engine, for example. In some arrangements, the gas turbine engine 10 may not comprise a gearbox 30.

The geometry of the gas turbine engine 10, and components thereof, is defined by a conventional axis system, comprising an axial direction (which is aligned with the rotational axis 9), a radial direction (in the bottom-to-top direction in FIG. 1), and a circumferential direction (perpendicular to the page in the FIG. 1 view). The axial, radial and circumferential directions are mutually perpendicular.

Figure 4:
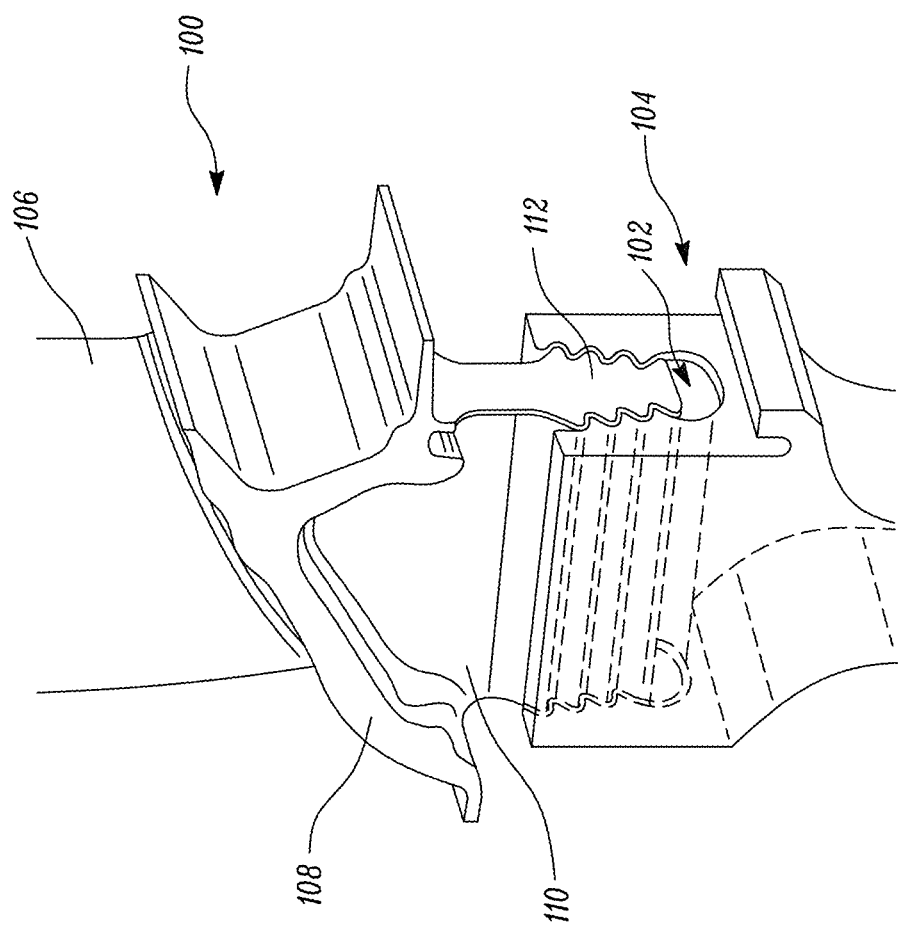
FIG. 4 is a schematic perspective view of a turbine blade mounted into a slot on a disc of the gas turbine engine.

FIG. 4 illustrates a turbine blade 100 mounted in a root slot 102 of a turbine disc 104. The gas turbine 10 (shown in FIG. 1) includes the turbine blade 100. Specifically, a turbine of the gas turbine engine 10 includes the turbine blade 100. The turbine can be the high pressure turbine 17 and/or the low pressure turbine 19.

The turbine blade 100 includes an aerofoil 106, a platform 108, a shank 110 and a root 112. The aerofoil 106 extends radially outward from the platform 108. The shank 110 and the root 112 extend radially inward from the platform 108 opposite to the aerofoil 106. The root 112 is at least partially received in the root slot 102 of the turbine disc 104. The turbine blade 100 may have internal cooling passages which carry cooling air in use to allow the blade to operate at high temperatures. In some embodiments, a coating 200 (shown in FIG. 5) is at least partially disposed on a substrate of the turbine blade 100. In some embodiments, the coating 200 is disposed on the shank 110 and the root 112 of the turbine blade 100.

Figure 5:
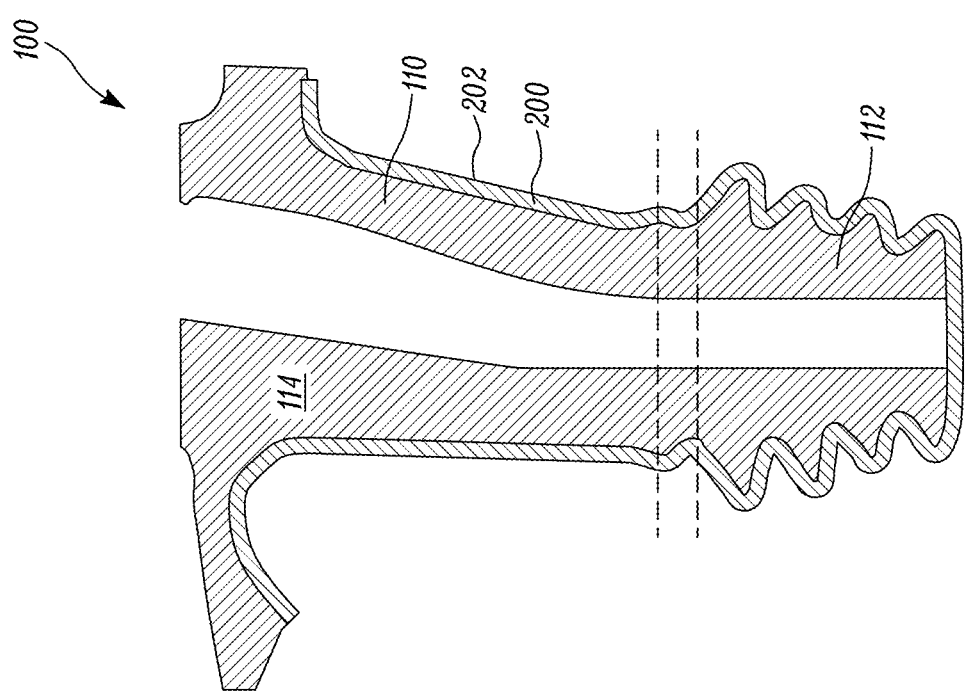
FIG. 5 is a schematic sectional view of a root and a shank of the turbine blade having a coating.

FIG. 5 shows a detailed view of the coating 200 of the turbine blade 100 according to an embodiment of the present disclosure. The coating 200 is at least partially disposed on a substrate 114 of the turbine blade 100. In the illustrated embodiment, the substrate 114 includes the shank 110 and the root 112. The coating 200 extends over at least the whole exterior surface of the root 110 and the shank 112. The coating 200 includes an outer surface 202. The outer surface 202 forms the exterior surface of the coating 200.

In some embodiments, the coating 200 includes platinum and chromium. In some embodiments, the coating 200 includes between about 8 wt. % to about 80 wt. % of chromium. In some other embodiments, the coating 200 includes between about 8 wt. % to about 30 wt. % of chromium. In some other embodiments, the coating 200 includes between about 9 wt. % to about 50 wt. % of chromium.

The turbine blade 100 may be manufactured from a metallic material, for example, a nickel based superalloy, a cobalt based superalloy, or other based superalloy that comprises a gamma prime phase matrix and a gamma prime phase in the gamma phase matrix. The substrate 114 may therefore be manufactured from a superalloy.

A platinum layer may be deposited using a standard electroplating process. Alternatively, chemical vapour deposition, physical vapour deposition, e.g., sputtering, plasma assisted chemical vapour deposition, or any other suitable process may be used provided a thickness of the deposited coating is above a defined minimum and is conformal without pores or blistering.

The deposited platinum layer may be subsequently heat treated at a temperature between 1000° C. and 1200° C. for 1 to 6 hours. This may produce a two phase (gamma-gamma prime) coating. The heat treatment of a 7 micron thick layer of platinum into the nickel base superalloy may result in a platinum enriched outer layer between about microns to about 30 microns thick.

The heat treatment of a 4 micron thick layer of platinum into the nickel based superalloy may result in a platinum enriched outer layer between about 12 to about microns thick. In some embodiments, a layer of platinum that is deposited is between about 5 to about 11.5 microns and generates an outer layer that is between about 5 and about 30 microns.

Following formation of the platinum layer, a layer of chromium may be deposited onto the platinum using a chemical vapour deposition process (CVD) to diffuse in about 8 to 80 wt. % chromium which interdiffuses the chromium with the platinum to form a single gamma phase structure. To achieve the desired interdiffusion, the CVD process may be run at 875° C. to 1200° C. for 1 to 12 hours. Further, the single phase structure forms a single gamma phase outer zone of the coating 200.

An example of the coating 200 is disclosed in United States patent application US 2014/0271220 A1, the disclosure of which is incorporated herein by reference in its entirety.

In the illustrated embodiment of FIGS. 4 and 5, the coating 200 is provided on the turbine blade 100. However, a coating similar to the coating 200 may be provided on any other article that may be used in the gas turbine engine 10 of FIG. 1. In some embodiments, the article is an aerofoil or a vane. In some other embodiments, the article may be used in boilers, such as biomass boilers. In some other embodiments, the article may be used in oil and gas industry. In some other embodiments, the article may be used in a nuclear reactor.

The article includes a substrate. The substrate may be made of a high performance alloy, such as nickel based superalloy. The article further includes the coating that is at least partially disposed on the substrate. The coating includes an outer surface. Specifically, the coating is disposed on at least a portion of an exterior surface of the substrate. In some cases, the coating may cover the whole exterior surface of the substrate.

In some embodiments, cold work is applied to the outer surface of the coating to produce a cold-worked layer. The cold-worked layer extends from the outer surface of the coating to a cold work depth. The cold-worked layer includes approximately 45% cold work to the cold work depth. In some embodiments, the cold work depth is between about 30 microns to about 150 microns from the outer surface of the coating. In some embodiments, the cold-worked layer further includes a chromia scale extending from the outer surface of the coating. In some embodiments, a thickness of the chromia scale is less than the cold work depth. In some embodiments, the thickness of the chromia scale is less than a thickness of the coating. In some embodiments, the cold work depth is greater than the thickness of the coating.

In some embodiments, applying the cold work includes shot peening the outer surface of the coating using shot. In some embodiments, an intensity of shot peening Is between about 2 A to about 12 A. In some embodiments, the shot is between about 070 to about 330 conforming to at least one of AMS2431/1, AMS2431/2, AMS2431/3, AMS2431/4, AMS2431/5, AMS2431/5, AMS2431/6, AMS2431/7, and AMS2431/8 specifications. In some embodiments, a coverage of shot peening is between about 95% to about 1200%.

In some other embodiments, applying the cold work includes deep cold rolling the outer surface of the coating.

The coating and the cold-worked layer may be applicable to articles made of superalloys, such as nickel based superalloys. Such articles may operate in a temperature range from 400° C. to 750° C. in corrosive contaminated environments.

Figure 6:
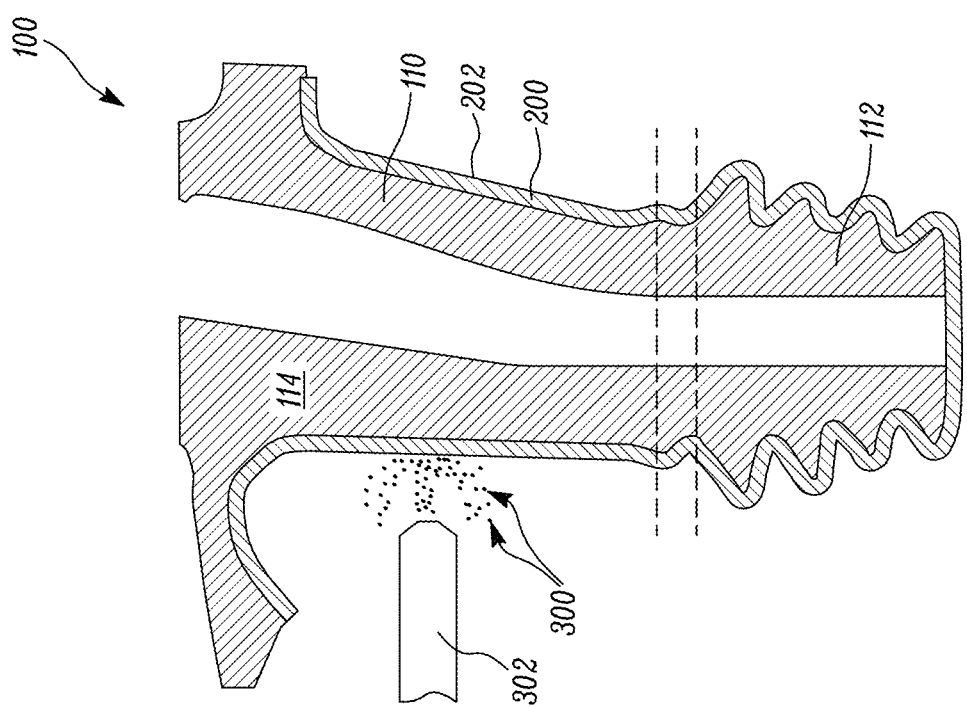
FIG. 6 is a schematic view of a cold working process carried out on the turbine blade.

FIG. 6 shows a cold working process carried out on the turbine blade 100 in accordance with an embodiment of the present disclosure. In the illustrated embodiment, the cold working process is a shot peening process. Shot peening includes impinging the outer surface 202 of the coating 200 of the turbine blade 100 with shot 300. Shot peening the outer surface 202 of the coating 200 may produce cold work at the outer surface 202. The shot 300 is discharged by a shot peening machine 302.

The shot peening may be carried out with predetermined values of various parameters, for example, shot size, shot hardness, intensity of shot peening, coverage of shot peening etc. In some embodiments, an intensity of shot peening is between about 2 A to about 12 A. In some other embodiments, an intensity of shot peening is between about 4 A to about 10 A. The intensity of shot peening is expressed as imperial intensity such that 2 A is equivalent to 0.002 inches, 4 A is equivalent to 0.004 inches, 10 A is equivalent to 0.010 inches, and 12 A is equivalent to 0.012 inches. In some embodiments, the shot 300 is between about 070 to about 330 conforming to specifications as per AMS2431. In some other embodiments, the shot 300 has 070H to 330H shot size with Vickers hardness of 45-62 Hv. In some other embodiments, the shot 300 has shot size between about 110H to about 230H as per AMS2431 specifications. In some embodiments, the coverage of shot peening is between about 80% to about 2500%. In some other embodiments, a coverage of shot peening is between about 95% to about 1200%.

Some exemplary AMS2431 specifications are provided in Table 1 below.

TABLE 1

Peening media and identification codes

| Specification | Description | Code |
|---|---|---|
| AMS243 1/1 | Cast Steel Shot, Regular Hardness (45 to 52 HRC) | ASR |
| AMS243 1/2 | Cast Steel Shot, High Hardness (55 to 62 HRC) | ASH |
| AMS243 1/3 | Conditioned Carbon Steel Cut Wire Shot, Regular Hardness (45 to 52 HRC) | AWCR |
| AMS243 1/4 | Conditioned Stainless-Steel Cut Wire Shot | AWS |
| AMS243 1/5 | Peening Balls | APB |
| AMS243 1/6 | Glass Shot | AGB |
| AMS243 1/7 | Ceramic Shot | AZB |
| AMS243 1/8 | Conditioned Carbon Steel Cut Wire Shot, High Hardness (55 to 62 HRC) | AWCH |

Some exemplary combinations of shot peening parameters are provided in Table 2 below.

TABLE 2

Shot peening parameters

| Shot Size (H) | Intensity (A) | Coverage (%) |
|---|---|---|
| 070 | 1-5 | 100-2000 |
| 110 | 2-10 | 100-2000 |
| 230 | 4-12 | 100-2000 |
| 110-230 | 4-10 | 95-12000 |

FIG. 7A illustrates a schematic sectional view of the coating 200 and a cold-worked layer 400 of the turbine blade 100 in accordance with an embodiment of the present disclosure. The cold-worked layer 400 and the coating 200 without cold work are both shown for illustrative purposes. Referring to FIGS. 4, 5 and 7A, the substrate 114 of the turbine blade 100 includes the coating 200 and the cold-worked layer 400. The substrate 114 may include the shank 110 and/or the root 112 of the turbine blade 100. The coating 200 is disposed on an exterior surface of the substrate 114. The coating 200 includes the outer surface 202 that defines the exterior surface of the coating 200. The coating 200 has a thickness T1. The cold-worked layer 400 may be formed due to cold working of the outer surface 202 of the coating 200. In some embodiments, the cold-worked layer 400 may be formed by shot peening as described above with reference to FIG. 6. In some other embodiments, the cold-work layer 400 may be formed by deep cold rolling of the outer surface 202 of the coating 200.

The coating 200 further includes a single gamma phase outer zone 204. The single gamma phase outer zone 204 may be enriched with chromium. The coating 200 may further include a platinum enriched inner zone (not shown) adjacent to the single gamma phase outer zone 204. A thickness T2 of the single gamma phase outer zone 204 may be a fraction of the thickness T2 of the coating 200. The single gamma phase outer zone 204 may be substantially devoid of phase boundaries. This may avoid regions at which the atomic structure can change and can cause strain due to in part to a mismatch in elemental makeup. Absence of phase boundaries may improve the corrosion resistance of the coating 200.

The cold-worked layer 400 may be formed due to plastic strain induced by cold working. The cold-worked layer 400 extends to a cold work depth CD from the outer surface 202 of the coating 200. In the illustrated embodiment, the cold work depth CD is greater than the thickness T1 of the coating 200. However, in some other embodiments, the cold work depth CD is less than or equal to the thickness T1 of the coating 200. In some embodiments, the cold work depth CD is between about 30 microns to about 150 microns from the outer surface 202 of the coating 200. In some other embodiments, the cold work depth CD is at least 10 microns, at least 50 microns, at least 70 microns, at least 100 micros, or at least 120 microns. In some other embodiments, the cold work depth CD is about 150 microns. In some embodiments, the cold-worked layer 400 includes approximately 45% cold work to the cold work depth CD. In some other embodiments, the cold-worked layer 400 includes approximately 10%, approximately 50%, approximately 60%, or approximately 80% cold work. The cold work may be uniform or variable across the cold work depth.

FIG. 7B illustrates the cold-worked layer 400 further including a chromia scale 402 extending from the outer surface 202 of the coating 200. Referring to FIGS. 4, 5 and 7B, the chromia scale 402 may be a stable oxidised layer of chromium formed in the single gamma phase outer zone 204 of the coating 200. The chromia scale 402 may also include other metal oxides. The chromia scale 402 may provide oxidation resistance in an oxidising environment. The chromia scale 402 may be formed due to exposure of the turbine blade 100 to a corrosive contaminated environment for a predetermined time period. For example, the chromia scale 402 may be formed due to exposure of the turbine blade 100 to an environment within the gas turbine engine 10 (shown in FIG. 1) for a predetermined time period of engine operation.

A thickness T3 of the chromia scale 402 may be less than or equal to the thickness T2 of the single gamma phase outer zone 204 of the coating 200. In the illustrated embodiment, the thickness T3 is less than the thickness T2. Therefore, the thickness T3 of the chromia scale 402 is less than the thickness T1 of the coating 200. Further, the thickness T3 of the chromia scale is less than the cold work depth CD. The comparison between the different thickness is mathematically represented as: T3<T2<T1<CD.

Figure 8:
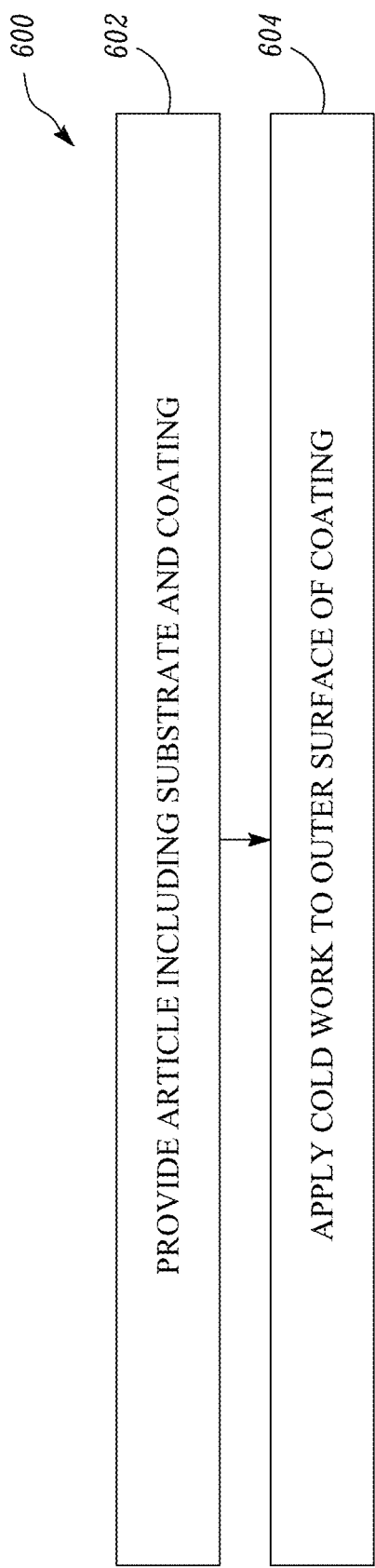
FIG. 8 is a flowchart of a method of manufacturing an article; and,
FIGS. 9A, 9B, and 9C are images depicting corrosion-fatigue performance of various articles.

FIG. 8 illustrates a method 600 of manufacturing an article. Referring to FIGS. 2-7B, the article may be the turbine blade 100. The turbine blade 100 will be interchangeably referred to as the article 100.

At step 602, the method 600 includes providing the article 100 including the substrate 114 and the coating 200 at least partially disposed on the substrate 114. The coating 200 includes the outer surface 202. The coating 200 further includes platinum and chromium. In some embodiments, the coating 200 further includes the single gamma phase outer zone 204. In some embodiments, the coating 200 includes between about 8 wt. % to about 80 wt. % of chromium.

At step 604, the method 600 further includes applying cold work to the outer surface 202 of the coating 200 to produce the cold-worked layer 400 extending from the outer surface 202 of the coating 200 to the cold work depth CD. In some embodiments, the cold-worked layer 400 includes approximately 45% cold work to the cold work depth CD. In some embodiments, the cold work depth CD is between about 30 microns to about 150 microns from the outer surface 202 of the coating 200.

In some embodiments, applying cold work further includes shot peening the outer surface 202 of the coating 200 using the shot 300. In some embodiments, the intensity of shot peening is between about 2 A to about 12 A. In some embodiments, the shot 300 is between about 070 to about 330 conforming to at least one of AMS2431/1, AMS2431/2, AMS2431/3, AMS2431/4, AMS2431/5, AMS2431/5, AMS2431/6, AMS2431/7, and AMS2431/8 specifications.

In some embodiments, the coverage of shot peening is between about 95% to about 1200%.

In some embodiments, applying cold work further includes deep cold rolling the outer surface 202 of the article 100.

In some embodiments, the cold-worked layer 400 further includes the chromia scale 402 extending from the outer surface 202 of the coating 200. The chromia scale 402 may be formed due to exposure of the article 100 to a corrosive contaminated environment for a predetermined time period. In some embodiments, the thickness T3 of the chromia scale 402 is less than the cold work depth CD. In some embodiments, the thickness T3 of the chromia scale 402 is less than the thickness T1 of the coating 200. In some embodiments, the cold work depth CD is greater than the thickness T1 of the coating 200.

The cold-worked layer 400 imparted by the method 600 may improve corrosion-fatigue performance of the article 100. Specifically, the cold-worked layer 400 may provide improved resistance of the article 100 to Type IV corrosion-fatigue attack. Imparting cold work to the outer surface 202 of the coating 200 may provide retardation of coating cracks in early stages of an attack mechanism associated with Type IV corrosion-fatigue attack. The chromia scale 402 may provide additional corrosion resistance. Since the corrosion kinetics at temperatures below 600° C. are typically very slow, the cold-worked layer 400 along with the chromia scale 402 may provide an improved combined resistance to Type IV corrosion-fatigue attack. The cold-worked layer 400 may therefore protect the coating 200 against Type IV corrosion-fatigue attack that could otherwise cause embrittling of the coating. The coating 200 may therefore continue to protect the substrate 114 from environmental degradation.

The coating 200 including platinum and chromium may also be referred to as a PtCr coating. The PtCr coating may also include the single gamma phase outer zone 204.

Figure 9A:
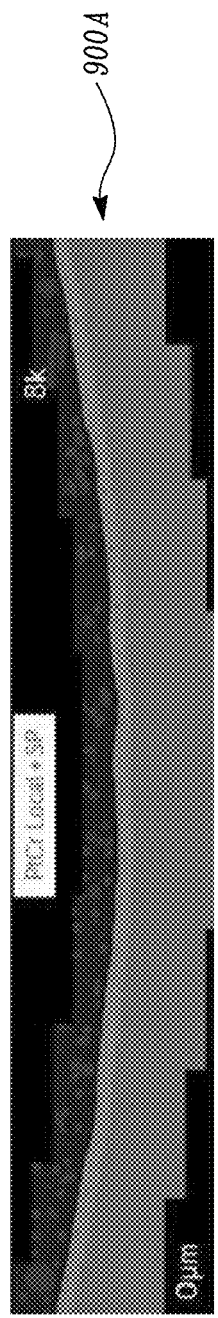
Figure 9B:
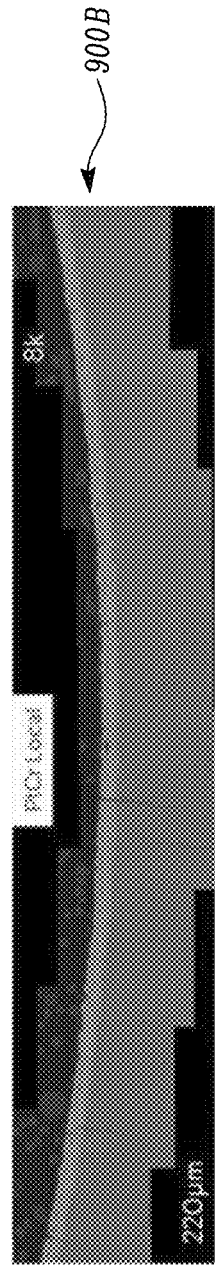
Figure 9C:
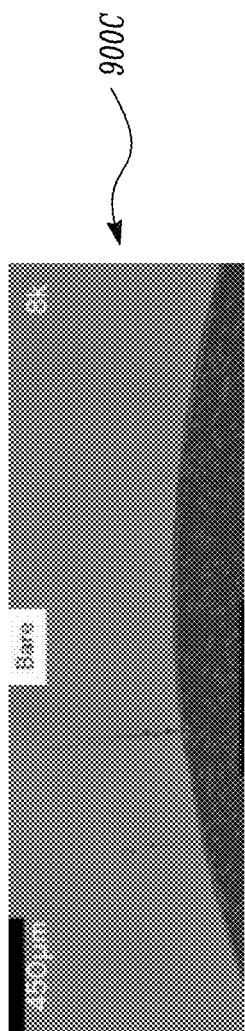

FIGS. 9A, 9B and 9C depict images of articles 900A, 900B and 900C, respectively. The article 900A includes a coating that has undergone cold working, i.e., shot peening. The coating is a PtCr coating. The article 900B includes a coating that has not undergone any cold working. The article 900C does not include any coating. The articles 900A, 900B, 900C were subjected to 560° C. notched corrosion-fatigue testing. It may be apparent from the images that articles 900B and 900C displays cracks in the PtCr coating. However, the article 900A that has been subjected to shot peening does not display any cracks. The addition of the cold-worked layer to the PtCr coating may therefore provide improved resistance against Type IV corrosion-fatigue attack as compared to PtCr coatings without any cold work.

The images depicted in FIGS. 9A, 9B and 9C were generated using scanning electron microscope (SEM) high magnification imaging.

Applying cold work to an outer surface or an exterior surface of a PtCr coating may improve corrosion-fatigue of an article including the PtCr coating. Specifically, a cold-work layer formed due to cold working may improve resistance of the article to Type IV corrosion-fatigue attack. Imparting shot peening to the outer surface of the coating may provide retardation of coating cracks in early stages of an attack mechanism associated with Type IV corrosion-fatigue attack. Cold working may also aid in the formation of a chromia scale extending from the outer surface of the coating. The chromia scale may be formed due to the chromium enriched outer zone (i.e., the single gamma phase outer zone) of the PtCr coating. The chromia scale may provide additional corrosion resistance. The combination of the cold-worked layer and the PtCr coating may therefore provide an improved corrosion resistance and crack retardation. Specifically, the cold-worked layer along with the chromia scale may provide an improved combined resistance to Type IV corrosion-fatigue attack. The corrosion-fatigue performance of the combination of the cold-worked layer and the PtCr coating may therefore be better than only cold work or only PtCr coating.

The various parameters of PtCr coating, the cold-work layer and shot peening can be measured using various methods. Some exemplary measurement methods are provided below.

Alicona surface roughness or SEM high magnification imaging may be used to measure shot peening dimple size. This can be cross correlated to the shot size used in the shot peening process.

Energy-dispersive X-ray spectroscopy (EDM) analyses may be used to determine a composition of the PtCr coating. SEM imaging may be used for microstructure and thickness measurements. Such analysis may be carried out on a cross-section of an article.

Cold work percent (%) can be measured using X-ray diffraction. Electron back scatter diffraction can be used to measure the depth of cold work. Nano-indentation can also be used to measure the depth of cold work. Micro-hardness tests can be used to measure residual stress and cold work depth profile. Cold work comparison between short peened articles and unpeened articles may be carried out using electron back scatter diffraction and kernel misorientation spread analysis. Electron back scatter diffraction may also be used to measure the chromia scale. Such measurements can be carried out on a cross-section of an article.

It will be understood that the invention is not limited to the embodiments above-described and various modifications and improvements can be made without departing from the concepts described herein. Except where mutually exclusive, any of the features and the disclosure extends to and includes all combinations and sub-combinations of one or more features described herein.

We claim:

1. A method of manufacturing an article, the method comprising the steps of:
    providing an article comprising a substrate and a PtCr coating at least partially disposed on the substrate, the PtCr coating comprising an outer surface and a single gamma phase outer zone, the PtCr coating comprising platinum and about 8 wt. % to about 30 wt. % of chromium, wherein the PtCr coating is formed by a process comprising depositing a platinum layer having a thickness of 4 to 7 microns on the substrate and following formation of the platinum layer, a layer of chromium is deposited onto the platinum using a chemical vapor deposition process (CVD) to diffuse in the chromium which interdiffuses the chromium with the platinum to form a single gamma phase structure, the single phase structure forming the single gamma phase outer zone of the PtCr coating; and
    applying cold work to the outer surface of the PtCr coating to produce a cold-worked layer extending from the outer surface of the PtCr coating to a cold work depth, wherein the cold-worked layer of the article comprises approximately 45% cold work, and wherein the cold work depth is between about 30 microns to about 150 microns from the outer surface of the PtCr coating; wherein
    the article is a turbine blade.

2. The method of claim 1, wherein applying cold work further comprises shot peening the outer surface of the PtCr coating using shot.

3. The method of claim 2, wherein an intensity of shot peening is between about 2A to about 12A, and wherein the intensity of shot peening is imperial intensity such that 2A is equivalent to 0.002 inches and 12A is equivalent to 0.012 inches.

4. The method of claim 2, wherein the shot is between about 070H to about 330H conforming to at least one of AMS2431/1, AMS2431/2, AMS2431/3, AMS2431/4, AMS2431/5, AMS2431/5, AMS2431/6, AMS2431/7, and AMS2431/8 specifications.

5. The method of claim 2, wherein a coverage of shot peening is between about 95% to about 1200%.

6. The method of claim 1, wherein applying cold work further comprises deep cold rolling the outer surface of the PtCr coating.

7. The method of claim 1, wherein the cold-worked layer further comprises a chromia scale extending from the outer surface of the PtCr coating, and wherein a thickness of the chromia scale is less than the cold work depth.

8. The method of claim 7, wherein the thickness of the chromia scale is less than a thickness of the PtCr coating.

9. The method of claim 8, wherein the cold work depth is greater than the thickness of the PtCr coating.

10. The method of claim 1, wherein the turbine blade comprises an aerofoil, a platform, a shank and a root, and wherein the PtCr coating is disposed on the shank and the root of the turbine blade.

* * * * *